(12) United States Patent
Priewasser et al.

(10) Patent No.: US 11,424,161 B2
(45) Date of Patent: Aug. 23, 2022

(54) SUBSTRATE PROCESSING METHOD

(71) Applicant: DISCO Corporation, Tokyo (JP)

(72) Inventors: Karl Heinz Priewasser, Munich (DE);
Tzanimir Arguirov, Munich (DE);
Yasuyoshi Yubira, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/823,983

(22) Filed: Mar. 19, 2020

(65) Prior Publication Data
US 2020/0312717 A1   Oct. 1, 2020

(51) Int. Cl.
| | | |
|---|---|---|
| H01L 21/304 | (2006.01) |
| H01L 21/78 | (2006.01) |
| H01L 21/683 | (2006.01) |
| B23K 26/53 | (2014.01) |
| H01L 23/544 | (2006.01) |
| H01L 23/00 | (2006.01) |
| B23K 26/0622 | (2014.01) |
| H01L 21/768 | (2006.01) |

(52) U.S. Cl.
CPC .......... *H01L 21/78* (2013.01); *B23K 26/0622* (2015.10); *B23K 26/53* (2015.10); *H01L 21/304* (2013.01); *H01L 21/6836* (2013.01); *H01L 21/76894* (2013.01); *H01L 23/544* (2013.01); *H01L 23/562* (2013.01)

(58) Field of Classification Search
CPC ... H01L 21/78; H01L 21/304; H01L 21/6836; H01L 23/544; H01L 21/76894; H01L 2221/68309; H01L 2221/68327; H01L 2221/6834; H01L 2223/5446; H01L 2223/54426; B23K 26/53; B23K 26/0622; B23K 26/18; B23K 2103/56; B23K 2103/54

See application file for complete search history.

(56) References Cited

U.S. PATENT DOCUMENTS 9,130,057 B1    9/2015  Kumar et al.
2018/0286754 A1*  10/2018  Takenouchi ........ H01L 21/2686

FOREIGN PATENT DOCUMENTS

| JP | 2005252078 A | 9/2005 |
|---|---|---|
| JP | 2009158648 A | 7/2009 |
| JP | 2009295899 A | 12/2009 |
| JP | 2010245172 A | 10/2010 |
| JP | 2011054841 A | 3/2011 |

(Continued)

*Primary Examiner* — Elias Ullah
(74) *Attorney, Agent, or Firm* — Greer Burns & Crain Ltd.

(57) ABSTRACT

A substrate having a first surface with at least one division line and an opposite second surface is processed by attaching a protective sheeting to the first surface and applying a laser beam to the protective sheeting to form a plurality of alignment marks in the protective sheeting. The substrate has a backside layer on the second surface. A laser beam is applied to the substrate from the side of the first surface. The substrate is transparent to the laser beam and the focal point of the laser beam is located inside the substrate which is closer to the second surface than to the first surface, to form a plurality of alignment marks in the backside layer. Substrate material is removed along the division line from the side of the second surface. The alignment marks are used for aligning the substrate material removing means relative to the division line.

13 Claims, 7 Drawing Sheets

(56) References Cited

FOREIGN PATENT DOCUMENTS

| | | | |
|---|---|---|---|
| JP | 2012230955 | A | 11/2012 |
| JP | 2015005610 | A | 1/2015 |
| JP | 2015023094 | A | 2/2015 |
| JP | 2016042526 | A | 3/2016 |
| JP | 2016171305 | A | 9/2016 |
| JP | 2019050249 | A | 3/2019 |
| TW | 201349319 | A | 12/2013 |
| TW | 201829109 | A | 8/2018 |
| TW | 201840381 | A | 11/2018 |
| TW | 201909262 | A | 3/2019 |
| TW | 201911397 | A | 3/2019 |

\* cited by examiner

SUBSTRATE PROCESSING METHOD

TECHNICAL FIELD

The present invention relates to a method of processing a substrate, having a first surface with at least one division line formed thereon and a second surface opposite the first surface.

TECHNICAL BACKGROUND

On substrates, such as wafers, e.g., semiconductor wafers, devices, such as integrated circuits (ICs), large scale integrations (LSIs) and light emitting diodes (LEDs), are formed by providing a device area on a front surface of the substrate. The substrate may be a wafer, for example, made of silicon carbide (SiC), gallium nitride (GaN), gallium arsenide (GaAs), silicon (Si) or the like. The devices may be, e.g., semiconductor devices for power semiconductors designed for power saving products.

In a semiconductor device fabrication process, a wafer having a device area with a plurality of devices partitioned by a plurality of division lines (also referred to as "streets") is divided into individual dies. This fabrication process generally comprises a cutting step of cutting the wafer along the division lines to obtain the individual dies. The wafer may be cut along the division lines from its front side or its back side.

In an optical device fabrication process, an optical device layer, e.g., composed of an n-type nitride semiconductor layer and a p-type nitride semiconductor layer, is formed on the front side of a single crystal substrate, such as a sapphire substrate, a silicon carbide substrate or a gallium nitride substrate. The optical device layer is partitioned by division lines to define separate regions where optical devices, such as light emitting diodes (LEDs) and laser diodes, are respectively formed. By providing the optical device layer on the front side of the single crystal substrate, an optical device wafer is formed. The optical device wafer is separated, e.g., cut, along the division lines to divide the separate regions where the optical devices are formed, thereby obtaining the individual optical devices as chips or dies.

As a method of dividing such substrates, it is conventional in the art to cut the substrate along the division lines from its front side where the division lines are formed, e.g., by blade dicing or laser cutting. In this way, alignment of a cutting means for cutting the substrate relative to the division lines to be cut is greatly facilitated. However, since also the device area is formed on the substrate front side, the quality of the devices may be affected by the cutting process. In particular, problems such as front side and/or back side chipping and degradation of the die strength of resulting chips or dies frequently occur.

In order to avoid these problems, it has been proposed to cut the substrate along the division lines from its back side. However, this approach renders alignment of the cutting means relative to the division lines to be cut considerably more difficult and significantly reduces the alignment accuracy. The reduction in alignment accuracy commonly has to be compensated by making the division lines wider, so as to increase the positioning tolerances of the cutting means. However, such a widening of the division lines reduces the number of devices which can be accommodated on the substrate, thus affecting the production efficiency and resulting in a waste of substrate material. This problem is particularly pronounced for the case of expensive substrate materials, such as SiC and GaAs.

The above problems are further aggravated if a backside layer, such as a metal layer, is present on the back side of the substrate. Commonly, the presence of such a backside layer renders the detection of the division lines from the substrate back side and, thus, the alignment of the cutting means even more difficult. In particular, the backside layer may block the transmission of light in the visible and/or infrared (IR) ranges. If, for example, two separate cameras are used to simultaneously image the substrate from its front and back sides in order to align the cutting means relative to the division lines, precisely synchronizing the cameras with each other is very difficult, commonly resulting in poor alignment accuracy.

Hence, there remains a need for a method of processing a substrate which allows for the substrate to be processed in an accurate and efficient manner.

SUMMARY OF THE INVENTION

Accordingly, it is an object of the present invention to provide a method of processing a substrate which allows for the substrate to be processed in an accurate and efficient manner. This goal is achieved by a substrate processing method with the technical features of claim 1 and by a substrate processing method with the technical features of claim 6. Preferred embodiments of the invention follow from the dependent claims.

The invention provides a method of processing a substrate, having a first surface with at least one division line formed thereon and a second surface opposite the first surface. The method comprises attaching a protective sheeting to the first surface, applying a laser beam to the protective sheeting so as to form a plurality of alignment marks in the protective sheeting, and removing substrate material along the at least one division line from the side of the second surface by using a substrate material removing means. The alignment marks are used for aligning the substrate material removing means relative to the at least one division line.

In the method of the invention, the substrate material is removed along the at least one division line from the side of the second surface. Hence, it can be reliably avoided that the integrity of the first surface is compromised by the substrate material removal process. In particular, if a device area with a plurality of devices is formed on the first surface, the risk that the quality of the devices may be affected by the removal of substrate material can be minimised. The occurrence of problems such as front side and/or back side chipping and degradation of the die strength of resulting chips or dies can be prevented.

Further, the laser beam is applied to the protective sheeting so as to form the plurality of alignment marks in the protective sheeting. In this way, the alignment marks can be formed in an efficient manner and with a high degree of accuracy.

The alignment marks thus formed are used for aligning the substrate material removing means relative to the at least one division line. Hence, the substrate material removing means can be aligned relative to the at least one division line with enhanced alignment accuracy, allowing for the substrate material removal process to be performed with a high degree of precision. Therefore, the width of the at least one division line can be reduced, enabling the accommodation of an increased number of elements, such as devices, on the first substrate surface. In this way, the production efficiency is significantly enhanced and the waste of substrate material is avoided. This is particularly advantageous for the case of expensive substrate materials, such as SiC and GaAs.

Hence, the processing method of the invention allows for the substrate to be processed in an accurate and efficient manner.

The laser beam applied to the protective sheeting so as to form the plurality of alignment marks in the protective sheeting may be a pulsed laser beam. The pulsed laser beam may have a pulse width, for example, in the range of 1 fs to 300 ns.

The laser beam may be applied to the protective sheeting so as to form the plurality of alignment marks in the protective sheeting after attaching the protective sheeting to the first surface. In this way, the accuracy of the positioning of the alignment marks in the protective sheeting relative to the at least one division line can be further enhanced.

The laser beam may be applied to the protective sheeting from the side of the first surface of the substrate.

The shapes and the arrangement of the alignment marks are not particularly limited. For example, each or some of the alignment marks may be in the form of one or more dots or one or more lines, e.g., curved and/or straight lines.

A plurality of division lines may be formed on the first surface of the substrate. The method may comprise removing substrate material along one or more, preferably all, of the division lines by using the substrate material removing means. In this case, the alignment marks are used for aligning the substrate material removing means relative to the division line or lines along which the substrate material is to be removed.

A device area with a plurality of devices may be formed on the first surface of the substrate. The devices may be partitioned by the at least one division line. The device area may comprise devices such as electronic devices, semiconductor devices, e.g., power semiconductor devices, in particular, energy efficient power semiconductor devices, or the like. The devices may comprise or be, for example, transistors, such as MOSFETs, e.g., SiC MOSFETs, or insulated-gate bipolar transistors (IGBTs), or diodes, e.g., Schottky barrier diodes.

The protective sheeting may be attached to the first surface of the substrate so as to cover the devices formed in the device area. The protective sheeting may protect the first substrate surface, in particular, the devices formed in the device area, e.g., against contamination and/or damage.

The substrate may be, for example, made of a semiconductor, glass, sapphire ($Al_2O_3$), a ceramic, such as an alumina ceramic, quartz, zirconia, PZT (lead zirconate titanate), a polycarbonate, an optical crystal material or the like. The substrate may be a wafer, such as a semiconductor wafer.

In particular, the substrate may be, for example, made of silicon carbide (SiC), silicon (Si), gallium arsenide (GaAs), gallium nitride (GaN), gallium phosphide (GaP), indium arsenide (InAs), indium phosphide (InP), silicon nitride (SiN), lithium tantalate (LT), lithium niobate (LN), aluminium nitride (AlN), silicon oxide ($SiO_2$) or the like. Particularly preferably, the substrate is made of SiC.

The substrate may be a single crystal substrate, a glass substrate, a compound substrate, such as a compound semiconductor substrate, e.g., an SiC, GaAs or GaN substrate, or a polycrystalline substrate, such as a ceramic substrate.

The width of the at least one division line may be 1 $\mu$m or less. The width of the at least one division line may be in the range of 1 $\mu$m to 200 $\mu$m, in the range of 10 $\mu$m to 100 $\mu$m or in the range of 10 $\mu$m to 50 $\mu$m.

A portion of the protective sheeting may laterally or radially extend beyond the first surface of the substrate. The lateral or radial directions of the substrate are perpendicular to the thickness direction of the substrate. The thickness direction of the substrate extends from the first substrate surface towards the second substrate surface. The portion of the protective sheeting laterally or radially extending beyond the first surface of the substrate may surround, in particular, circumferentially surround, the first surface of the substrate.

The portion of the protective sheeting may laterally or radially extend beyond the first surface of the substrate, for example, by 10 $\mu$m to 1000 $\mu$m, or by 1000 $\mu$m or more. The portion of the protective sheeting may laterally or radially extend beyond an outer edge of the substrate, e.g., by 10 $\mu$m to 1000 $\mu$m, or by 1000 $\mu$m or more.

At least one, preferably some or particularly preferably all, of the alignment marks may be formed in the portion of the protective sheeting laterally or radially extending beyond the first surface. In this way, the substrate material removing means can be aligned relative to the at least one division line with particularly high alignment accuracy, allowing for the substrate material removal process to be performed with an especially high degree of precision.

The portion of the protective sheeting laterally or radially extending beyond the first surface may extend along the thickness direction of the substrate from the first surface towards the second surface. The portion of the protective sheeting laterally or radially extending beyond the first surface may extend from the first surface towards the second surface along 10% or more, 20% or more, 30% or more, 40% or more, 50% or more, 60% or more, 70% or more, 80% or more, or 90% or more of the thickness of the substrate. The portion of the protective sheeting laterally or radially extending beyond the first surface may extend from the first surface towards the second surface along substantially the entire thickness of the substrate.

At least one, preferably some or particularly preferably all, of the alignment marks may be formed in the portion of the protective sheeting laterally or radially extending beyond the first surface in a position which is closer to the second surface than to the first surface. In this way, the alignment accuracy with which the substrate material removing means can be aligned relative to the at least one division line can be enhanced even further.

The at least one, preferably some or particularly preferably all, of the alignment marks may be formed in the portion of the protective sheeting laterally or radially extending beyond the first surface in a position in which a ratio of a second distance, between the position and the second surface in the substrate thickness direction, and a first distance, between the position and the first surface in the substrate thickness direction, is 0.9 or less, 0.8 or less, 0.7 or less, 0.6 or less, 0.5 or less, 0.4 or less, 0.3 or less, 0.2 or less, or 0.1 or less. The at least one, preferably some or particularly preferably all, of the alignment marks may be formed in a position which is, at least substantially, arranged at the second surface of the substrate.

A backside layer may be formed on the second surface of the substrate. The backside layer may be a conductive layer. For example, the backside layer may be a metal layer. The backside layer may be formed of a material, such as a metal, which is at least substantially opaque to light in the visible and/or infrared (IR) ranges.

In the method of the present invention, the alignment marks formed in the protective sheeting are used for aligning the substrate material removing means relative to the at least one division line. Hence, the alignment process is not compromised by the presence of the backside layer and, thus, can be performed with a high degree of accuracy. Therefore, the method is particularly advantageous for processing substrates with a backside layer, such as a metal layer, on the second substrate surface.

The backside layer, such as a metal layer, may cover, at least substantially, the entire second surface of the substrate. Also in this case, the substrate material removing means can be reliably and accurately aligned relative to the at least one division line by using the alignment marks in the protective sheeting.

The backside layer, such as a metal layer, may cover only a part of the second surface of the substrate. In particular, the backside layer may only be provided in a central portion of the second surface. In this case, the backside layer may not be present in a peripheral or circumferential portion of the second surface which surrounds, i.e., circumferentially surrounds, the central portion of the second surface. The peripheral or circumferential portion of the second surface may have a width, e.g., a ring width, in the range of 0.1 mm to 3 mm. The backside layer may be present only in an area of the second surface which corresponds to the device area formed on the first surface.

The substrate may have, on the first surface, a peripheral marginal area having no devices and being formed around, i.e., so as to surround, the device area. The backside layer may be arranged so as not to be present in an area of the second surface which corresponds to the peripheral marginal area of the first surface.

The protective sheeting may comprise or consist of a protective film.

The protective film may be applied to the first surface so that an entire front surface of the protective film is in direct contact with the first surface. In this case, no material, in particular, no adhesive, is present between the front surface of the protective film and the first surface.

Therefore, the risk of a possible contamination of or damage to the first surface, e.g., due to an adhesive force of an adhesive layer or adhesive residues on the substrate, can be reliably eliminated.

The protective film may be attached to the first surface by applying an external stimulus to the protective film during and/or after applying the protective film to the first surface. Applying the external stimulus to the protective film may comprise or consist of heating the protective film and/or cooling the protective film and/or applying a vacuum to the protective film and/or irradiating the protective film with radiation, such as light, e.g., by using a laser beam. The external stimulus may comprise or be a chemical compound and/or electron or plasma irradiation and/or mechanical treatment, such as pressure, friction or ultrasound application, and/or static electricity.

Alternatively or in addition, the protective film may be provided with an adhesive layer, wherein the adhesive layer is provided only in a peripheral area of the front surface of the protective film, the peripheral area surrounding a central area of the front surface of the protective film. In this case, no adhesive is present in the central area of the front surface of the protective film. In the central area of the front surface of the protective film, the front surface of the protective film and the first surface may be in direct contact with each other. The protective film may be applied to the first surface so that the adhesive layer comes into contact only with a peripheral portion of the first surface. The peripheral portion of the first surface with which the adhesive layer comes into contact may be, for example, the peripheral marginal area of the first surface in which no devices are present.

Hence, the risk of a possible contamination of or damage to the first surface, e.g., due to the adhesive force of the adhesive layer or adhesive residues on the substrate, can be significantly reduced or even eliminated.

The protective film may be made of a single material, in particular, a single homogeneous material.

The protective film may be made of a plastic material, such as a polymer. For example, the protective film may be made of a polyolefin. In particular, the protective film may be made of polyethylene (PE), polypropylene (PP) or polybutylene (PB).

The protective film may be heat resistant up to a temperature of 180° C. or more, preferably up to a temperature of 220° C. or more, more preferably up to a temperature of 250° C. or more, and even more preferably up to a temperature of 300° C. or more.

The protective film may have a thickness in the range of 5 to 200 μm, preferably 8 to 100 μm, more preferably 10 to 80 μm and even more preferably 12 to 50 μm.

The protective sheeting may comprise or consist of a cushioning layer. The protective sheeting may comprise or consist of the protective film and the cushioning layer.

The cushioning layer may be attached to a back surface of the protective film opposite to the front surface thereof. If the cushioning layer is attached to the back surface of the protective film, protrusions projecting from the first surface along the thickness direction of the substrate can be embedded in the cushioning layer.

The protective sheeting, in particular, the protective sheeting comprising or consisting of the cushioning layer, can serve as a carrier for supporting the substrate during the removal of substrate material along the at least one division line from the side of the second surface by using the substrate material removing means. In this way, an undesired shift of the substrate or of elements obtained from the substrate, such as chips or dies, can be reliably avoided.

The material of the cushioning layer is not particularly limited. In particular, the cushioning layer may be formed of any type of material which allows for protrusions protruding along the thickness direction of the substrate to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be heat resistant up to a temperature of 180° C. or more, preferably up to a temperature of 220° C. or more, more preferably up to a temperature of 250° C. or more, and even more preferably up to a temperature of 300° C. or more.

The cushioning layer may have a thickness in the range of 10 to 300 μm, preferably 20 to 250 μm and more preferably 50 to 200 μm.

The protective sheeting may comprise or consist of a base sheet. The protective sheeting may comprise or consist of the cushioning layer and the base sheet. The protective sheeting may comprise or consist of the protective film, the cushioning layer and the base sheet.

The base sheet may be attached to the back surface of the cushioning layer opposite to the front surface thereof which is attached to the protective film.

The material of the base sheet is not particularly limited. The base sheet may be made of a soft or pliable material, such as, for example, a polymer material, e.g., polyvinyl chloride (PVC), ethylene vinyl acetate (EVA) or a polyolefin.

Alternatively, the base sheet may be made of a rigid or hard material, such as polyethylene terephthalate (PET) and/or silicon and/or glass and/or stainless steel (SUS).

Also, the base sheet may be formed of a combination of the materials listed above.

The base sheet may be heat resistant up to a temperature of 180° C. or more, preferably up to a temperature of 220° C. or more, more preferably up to a temperature of 250° C. or more, and even more preferably up to a temperature of 300° C. or more.

The base sheet may have a thickness in the range of 30 to 1500 μm, preferably 40 to 1200 μm and more preferably 50 to 1000 μm.

A front surface of the base sheet may be in contact with the back surface of the cushioning layer, and a back surface of the base sheet opposite to the front surface thereof may be substantially parallel to the second surface of the substrate. Thus, when removing substrate material along the at least one division line from the side of the second surface by using the substrate material removing means, a suitable counter pressure can be applied to the back surface of the base sheet, e.g., by placing this back surface on a chuck table.

The protective sheeting may be made of a material which is transparent to the laser beam, i.e., the laser beam which is applied so as to form the plurality of alignment marks in the protective sheeting. The protective film may be made of a material which is transparent to the laser beam. The cushioning layer may be made of a material which is transparent to the laser beam. The base sheet may be made of a material which is transparent to the laser beam.

The laser beam may be applied to the protective sheeting so as to form one, some or all of the plurality of alignment marks in the protective film and/or the cushioning layer and/or the base sheet.

The portion of the protective sheeting laterally or radially extending beyond the first surface and extending along the thickness direction of the substrate from the first surface towards the second surface may be, at least substantially, a portion of the cushioning layer.

The invention further provides a method of processing a substrate, having a first surface with at least one division line formed thereon and a second surface opposite the first surface, wherein a backside layer is formed on the second surface. The method comprises applying a laser beam to the substrate from the side of the first surface, wherein the substrate is made of a material which is transparent to the laser beam and the laser beam is applied to the substrate in a condition where a focal point of the laser beam is located at a position inside the substrate which is closer to the second surface than to the first surface, so as to form a plurality of alignment marks in the backside layer and/or in a region of the second surface in which the backside layer is not present. The method further comprises removing substrate material along the at least one division line from the side of the second surface by using a substrate material removing means. The alignment marks are used for aligning the substrate material removing means relative to the at least one division line.

The substrate, the at least one division line, the backside layer and the alignment marks may have the same features, properties and characteristics as described above.

In the method of the invention, the substrate material is removed along the at least one division line from the side of the second surface. Hence, it can be reliably avoided that the integrity of the first surface is compromised by the substrate material removal process. In particular, if a device area with a plurality of devices is formed on the first surface, the risk that the quality of the devices may be affected by the removal of substrate material can be minimised. The occurrence of problems such as front side and/or back side chipping and degradation of the die strength of resulting chips or dies can be prevented.

Further, the laser beam is applied to the substrate in a condition where the focal point of the laser beam is located at a position inside the substrate which is closer to the second surface than to the first surface, so as to form the plurality of alignment marks in the backside layer and/or in a region of the second surface in which the backside layer is not present. In this way, the alignment marks can be formed in an efficient manner and with a high degree of accuracy. In particular, by arranging the focal point of the laser beam at a position inside the substrate which is closer to the second surface than to the first surface, it can be reliably ensured that the alignment marks are clearly visible from the side of the second surface.

The alignment marks thus formed are used for aligning the substrate material removing means relative to the at least one division line. Hence, the substrate material removing means can be aligned relative to the at least one division line with enhanced alignment accuracy, allowing for the substrate material removal process to be performed with a high degree of precision. Therefore, the width of the at least one division line can be reduced, enabling the accommodation of an increased number of elements, such as devices, on the first substrate surface. In this way, the production efficiency is significantly enhanced and the waste of substrate material is avoided. This is particularly advantageous for the case of expensive substrate materials, such as SiC and GaAs.

Hence, the processing method of the invention allows for the substrate to be processed in an accurate and efficient manner.

The focal point of the laser beam may be located at a position inside the substrate in which a ratio of a second distance, between the position and the second surface in the substrate thickness direction, and a first distance, between the position and the first surface in the substrate thickness direction, is 0.9 or less, 0.8 or less, 0.7 or less, 0.6 or less, 0.5 or less, 0.4 or less, 0.3 or less, 0.2 or less, or 0.1 or less. The focal point of the laser beam may be located at a position inside the substrate which is, at least substantially, arranged at the second surface of the substrate. The focal point of the laser beam may be located at a position inside the substrate which is, at least substantially, arranged at an interface between the second surface of the substrate and the backside layer.

Since the focal point of the laser beam is arranged at a position inside the substrate which is closer to the second surface than to the first surface, it can be ensured that a considerable portion of the laser beam is absorbed at and/or close to the second substrate surface, e.g., at and/or close to the interface between the second substrate surface and the backside layer. Hence, the alignment marks can be formed in an efficient manner and with a high degree of accuracy, in particular, so as to be clearly visible from the side of the second surface. For example, the alignment marks may be formed in the backside layer by at least partially melting the backside layer.

The laser beam applied to the substrate so as to form the plurality of alignment marks in the backside layer and/or in a region of the second surface in which the backside layer is not present may be a pulsed laser beam. The pulsed laser beam may have a pulse width, for example, in the range of 1 fs to 300 ns.

The shapes and the arrangement of the alignment marks are not particularly limited. For example, each or some of the alignment marks may be in the form of one or more dots or one or more lines, e.g., curved and/or straight lines.

A plurality of division lines may be formed on the first surface of the substrate. The method may comprise removing substrate material along one or more, preferably all, of the division lines by using the substrate material removing means. In this case, the alignment marks are used for aligning the substrate material removing means relative to the division line or lines along which the substrate material is to be removed.

A device area with a plurality of devices may be formed on the first surface of the substrate. The devices may be partitioned by the at least one division line. The device area may comprise devices such as electronic devices, semiconductor devices, e.g., power semiconductor devices, in particular, energy efficient power semiconductor devices, or the like. The devices may comprise or be, for example, transistors, such as MOSFETs, e.g., SiC MOSFETs, or insulated-gate bipolar transistors (IGBTs), or diodes, e.g., Schottky barrier diodes.

The backside layer may be a conductive layer. For example, the backside layer may be a metal layer. The backside layer may be formed of a material, such as a metal, which is at least substantially opaque to light in the visible and/or infrared (IR) ranges.

In the method of the present invention, the alignment marks formed in the backside layer and/or in a region of the second surface in which the backside layer is not present are used for aligning the substrate material removing means relative to the at least one division line. Hence, the alignment process is not compromised by the presence of the backside layer and, thus, can be performed with a high degree of accuracy.

The backside layer, such as a metal layer, may cover, at least substantially, the entire second surface of the substrate. If the backside layer covers the entire second substrate surface, all of the alignment marks are formed in the backside layer. In this case, the substrate material removing means can be reliably and accurately aligned relative to the at least one division line by using the alignment marks in the backside layer.

The backside layer, such as a metal layer, may cover only a part of the second surface of the substrate. In particular, the backside layer may only be provided in a central portion of the second surface. In this case, the backside layer may not be present in a peripheral or circumferential portion of the second surface which surrounds, i.e., circumferentially surrounds, the central portion of the second surface. The backside layer may be present only in an area of the second surface which corresponds to the device area formed on the first surface.

The substrate may have, on the first surface, a peripheral marginal area having no devices and being formed around, i.e., so as to surround, the device area. The backside layer may be arranged so as not to be present in an area of the second surface which corresponds to the peripheral marginal area of the first surface.

If the backside layer covers only a part of the second substrate surface, all of the alignment marks may be formed in the backside layer, all of the alignment marks may be formed in the region of the second surface in which the backside layer is not present, or some of the alignment marks may be formed in the backside layer and some of the alignment marks may be formed in the region of the second surface in which the backside layer is not present. Also in any of these cases, the substrate material removing means can be reliably and accurately aligned relative to the at least one division line by using the alignment marks.

The method may further comprise attaching a protective sheeting to the first surface. The protective sheeting may be made of a material which is transparent to the laser beam, i.e., the laser beam applied to the substrate so as to form the plurality of alignment marks in the backside layer and/or in a region of the second surface in which the backside layer is not present. The protective sheeting may be attached to the first surface before applying the laser beam to the substrate. The laser beam may be applied to the substrate through the protective sheeting, i.e., so that the laser beam is transmitted through the protective sheeting.

The protective sheeting may be attached to the first surface of the substrate so as to cover the devices formed in the device area. The protective sheeting may protect the first substrate surface, in particular, the devices formed in the device area, e.g., against contamination and/or damage.

The protective sheeting may have the same features, properties and characteristics as described above. In particular, the protective sheeting may comprise or consist of the protective film and/or the cushioning layer and/or the base sheet as described above.

The methods of the invention may further comprise applying a laser beam to the substrate from the side of the first surface, wherein the substrate is made of a material which is transparent to the laser beam and the laser beam is applied to the substrate at least in a plurality of positions along the at least one division line, so as to form a plurality of modified regions in the substrate.

The laser beam applied to the substrate so as to form the plurality of modified regions in the substrate may be a pulsed laser beam. The pulsed laser beam may have a pulse width, for example, in the range of 1 fs to 300 ns.

The laser beam applied to the substrate so as to form the plurality of modified regions in the substrate may be the same laser beam as the laser beam applied to the protective sheeting so as to form the plurality of alignment marks in the protective sheeting or a different laser beam.

The laser beam applied to the substrate so as to form the plurality of modified regions in the substrate may be the same laser beam as the laser beam applied to the substrate so as to form the plurality of alignment marks in the backside layer and/or in a region of the second surface in which the backside layer is not present or a different laser beam.

The laser beam for forming the plurality of modified regions in the substrate may be applied to the substrate after applying to the substrate the laser beam for forming the plurality of alignment marks in the backside layer and/or in a region of the second surface in which the backside layer is not present. In this way, it can be ensured that the alignment marks are formed with a particularly high degree of accuracy. In particular, it can be reliably avoided that the modified regions formed in the substrate interfere with the process of applying the laser beam for forming the plurality of alignment marks in the backside layer and/or in a region of the second surface in which the backside layer is not present.

Alternatively, the laser beam for forming the plurality of modified regions in the substrate may be applied to the substrate before applying to the substrate the laser beam for forming the plurality of alignment marks in the backside layer and/or in a region of the second surface in which the backside layer is not present.

The laser beam for forming the plurality of modified regions in the substrate may be applied to the substrate after applying to the protective sheeting the laser beam for forming the plurality of alignment marks in the protective sheeting.

Alternatively, the laser beam for forming the plurality of modified regions in the substrate may be applied to the substrate before applying to the protective sheeting the laser beam for forming the plurality of alignment marks in the protective sheeting.

If a plurality of division lines is formed on the first substrate surface, the method may comprise applying the laser beam to the substrate from the side of the first surface at least in a plurality of positions along one or more, preferably all, of the division lines. In this case, a plurality of modified regions is formed in the substrate at least in a plurality of positions along the one or more, preferably all, of the division lines.

The laser beam may be applied to the substrate at least in a plurality of positions along the at least one division line in a condition where a focal point of the laser beam is located at a distance from the first surface in the direction from the first surface towards the second surface. Alternatively, the laser beam may be applied to the substrate at least in a plurality of positions along the at least one division line in a condition where the focal point of the laser beam is located at a distance from the first surface in the direction opposite to the direction from the first surface towards the second surface.

Each modified region may be arranged entirely within the bulk of the substrate, i.e., inside the substrate. In this case, the modified regions do not extend all the way to the first surface, i.e., so as to reach the first surface, and the modified regions do not extend all the way to the second surface, i.e., so as to reach the second surface. Alternatively, at least one, some or all of the modified regions may extend to the first and/or second surfaces.

The modified region is a region of the substrate which has been modified by the application of the laser beam, such as a pulsed laser beam. For example, the modified region may be a region of the substrate in which the structure of the substrate material has been modified by the application of the laser beam.

The modified region may comprise or be an amorphous region or a region in which cracks are formed. The modified region may comprise or be composed of a space, e.g., a cavity, inside the substrate material, the space being surrounded by an amorphous region or a region in which cracks are formed.

If the modified region comprises or is a region in which cracks are formed, i.e., cracks have been formed, the cracks may be microcracks. The cracks may have dimensions, e.g., lengths and/or widths, in the μm range. For example, the cracks may have widths in the range of 0.1 μm to 100 μm and/or lengths in the range of 1 μm to 1000 μm.

The plurality of modified regions may be formed in the substrate so that a distance between centres of adjacent modified regions in the extension direction of the at least one division line is in the range of 0.1 μm to 50 μm, preferably 0.1 μm to 30 μm and more preferably 0.1 μm to 15 μm.

The modified regions may be equidistantly spaced in the extension direction of the at least one division line. Alternatively, some or all of adjacent or neighbouring modified regions may have different distances from each other in the extension direction of the at least one division line.

The modified regions may have diameters in the range of 0.1 μm to 30 μm, preferably 0.1 μm to 20 μm and more preferably 0.1 μm to 10 μm.

The plurality of modified regions may be formed in the substrate so that adjacent or neighbouring modified regions do not overlap each other. In this way, it can be particularly reliably ensured that the substrate maintains a sufficient degree of strength or robustness for allowing efficient further handling and/or processing thereof, in particular, in the step of removing substrate material along the at least one division line.

The distance between outer edges of adjacent or neighbouring modified regions in the width direction of the at least one division line and/or in the extension direction of the at least one division line may be at least 1 μm.

The plurality of modified regions may be formed in the substrate so that adjacent or neighbouring modified regions at least partially overlap each other, e.g., in the width direction of the at least one division line and/or in the extension direction of the at least one division line.

The modified regions may be formed so as to extend along only a part of the thickness, in the direction from the first surface towards the second surface, of the substrate. Some or all of the modified regions may be formed so as to extend along 5% or more and 60% or less, preferably 10% or more and 40% or less, and more preferably 15% or more and 30% or less of the thickness of the substrate.

Forming the modified regions with a large extension along the thickness of the substrate is particularly preferable in view of an enhanced service life of the substrate material removing means, in particular, a blade or a saw.

The amount of the extension of some or all of the modified regions along the thickness of the substrate can be appropriately chosen, e.g., depending on whether it is intended to fully or partially remove substrate material along the thickness of the substrate, e.g., by fully or partially cutting the substrate along its thickness.

The amount of extension of the modified regions along the thickness of the substrate and the position of the modified regions along the thickness of the substrate can be accurately controlled, for example, by locating the focal point of the laser beam at an appropriate distance from the first surface, e.g., in the direction from the first surface towards the second surface.

In some embodiments of the present invention, in each of the plurality of positions along the at least one division line where the laser beam is applied, plural modified regions, e.g., two or more, three or more, four or more, five or more, or six or more modified regions, may be formed and the plural modified regions may be arranged next to one another along the direction from the first surface towards the second surface, i.e., along the thickness direction of the substrate. In this way, plural layers of modified regions can be formed, wherein the plural layers are stacked along the thickness direction of the substrate. Such a stack of layers of modified regions can extend over 30% or more, 40% or more, 50% or more, 60% or more, 70% or more, 80% or more, or 90% or more of the thickness of the substrate.

In the methods of the invention, the substrate material may be mechanically removed along the at least one division line. In particular, the substrate material may be removed along the at least one division line by mechanically cutting the substrate along the at least one division line.

The substrate material may be removed by cutting the substrate along the at least one division line. For example, the substrate may be cut by using, as the substrate material removing means, a mechanical cutting means, such as a blade or a saw. The substrate material may be removed by laser cutting, in particular, by laser ablation, using a laser cutting means as the substrate material removing means. The substrate material may be removed by plasma cutting, e.g., using a plasma source or the like as the substrate material removing means. Cutting the substrate is a particularly efficient, simple and reliable way of removing the substrate material along the at least one division line.

The formation of a plurality of modified regions in the substrate along the at least one division line reduces the strength of the substrate in the areas where the modified regions are formed. Hence, by forming such modified regions in the substrate, the removal of substrate material along the at least one division line can be considerably facilitated. In particular, the mechanical removal of substrate material, e.g., the mechanical cutting of the substrate, along the at least one division line can be performed in a more efficient manner, e.g., with an increased processing speed. For example, for the case of a blade or saw dicing process, the blade or saw dicing speed can be significantly increased.

In the methods of the invention, the substrate material may be removed along only a part of the thickness, in the direction from the second surface towards the first surface, of the substrate. The substrate material may be removed along 30% or more, preferably 40% or more, more preferably 50% or more, even more preferably 60% or more and yet even more preferably 70% or more of the thickness of the substrate.

The substrate material may be removed along the entire thickness of the substrate. In this way, the substrate is divided along the at least one division line by the substrate material removing process.

The substrate material may be removed along the entire extension, in the direction from the second surface towards the first surface, of the modified regions, or along only a part of this extension. By removing the substrate material along the entire extension of the modified regions, the die strength of elements, such as chips or dies, obtained from the substrate can be further increased. The substrate material may be removed along 30% or more, preferably 40% or more, more preferably 50% or more, even more preferably 60% or more and yet even more preferably 70% or more of the extension of the modified regions.

The methods of the invention may further comprise applying an external force to the substrate, after removing substrate material along the at least one division line, so as to divide the substrate along the at least one division line.

For example, the external force may be applied to the substrate by radially expanding the protective sheeting, i.e., by using the protective sheeting as an expansion tape.

Alternatively, for example, if no protective sheeting is used, an expansion tape may be attached to the first substrate surface. Subsequently, the substrate may be divided along the at least one division line by radially expanding the expansion tape.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing a wafer as a substrate.

Figure 1:
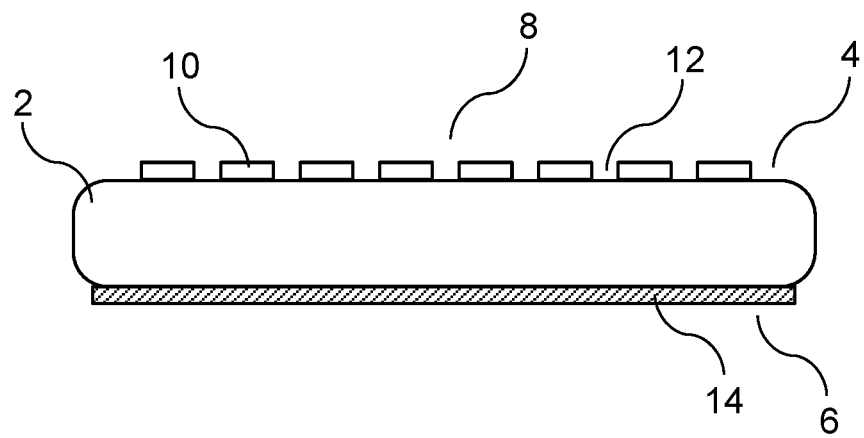
FIG. 1 is a cross-sectional view showing a wafer as a substrate to be processed by embodiments of the methods of the present invention.

FIG. 1 is a cross-sectional view of a substrate 2 to be processed by the embodiments of the methods of the present invention. The substrate 2 is a semiconductor wafer, in particular, an SiC wafer. However, different types of substrate and, in particular, different substrate materials may be used, as has been detailed above.

As is shown in FIG. 1, the substrate 2 has a first surface 4 and a second surface 6 opposite the first surface 4. The first surface 4 and the second surface 6 are substantially parallel to each other. On the first surface 4, a device area 8 with a plurality of devices 10 is formed. The devices 10 are partitioned by a plurality of division lines 12 which are also formed on the first surface 4. The division lines 12 are substantially arranged in a lattice pattern. The devices 10 may comprise or be, for example, transistors, such as MOSFETs or insulated-gate bipolar transistors (IGBTs), or diodes, e.g., Schottky barrier diodes.

A backside layer 14 is formed on the second surface 6. The backside layer 14 is a metal layer which is at least substantially opaque to light in the visible and infrared (IR) ranges. The backside layer 14 covers almost the entire second surface 6 with the exception of a small peripheral portion of the second surface 6 (see FIG. 1).

In the following, a first embodiment of the method of the present invention will be described with reference to FIGS. 2 to 7.

Figure 2:
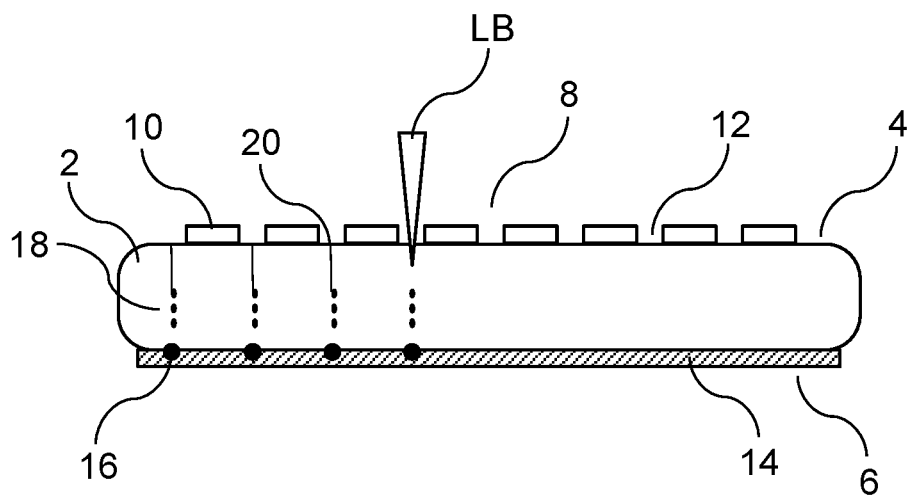
FIG. 2 is a cross-sectional view illustrating a step of applying a laser beam to the substrate according to a first embodiment of the method of the present invention.

A pulsed laser beam LB is applied to the substrate 2 from the side of the first surface 4, as is indicated by an arrow in FIG. 2. The pulsed laser beam LB may have a pulse width, for example, in the range of 1 fs to 300 ns. The material of the substrate 2, in particular, SiC, is transparent to the pulsed laser beam LB so that the pulsed laser beam LB is transmitted through the substrate 2. The pulsed laser beam LB is applied to the substrate 2 in a condition where a focal point of the pulsed laser beam LB is located at a position which is, at least substantially, arranged at an interface between the second surface 6 of the substrate 2 and the backside layer 14. This arrangement of the focal point is not illustrated in FIG. 2. By locating the focal point at least substantially at the interface between the second surface 6 of the substrate 2 and the backside layer 14, a considerable portion of the pulsed laser beam LB is absorbed at this interface, thereby at least partially melting the backside layer 14. In this way, an alignment mark 16 is formed in the backside layer 14 (see FIG. 2). Subsequently, the focal point of the pulsed laser beam LB is moved in the lateral direction of the substrate 2 so as to form further alignment marks 16 at different positions in the backside layer 14. By using the pulsed laser beam LB in this manner, a plurality of alignment marks 16 can be formed in the backside layer 14 in an efficient manner and with a high degree of accuracy, in particular, so as to be clearly visible from the side of the second surface 6.

For example, the pulsed laser beam LB applied to the substrate 2 for forming the plurality of alignment marks 16 may have the following properties:
Wavelength: 300 to 1100 nm,
Pulse width: 10 to 100 ns,
Pulse energy: 1 to 10 µJ,
Pulse pitch (centre to centre): 0.5 to 4 µm.

Figure 3:
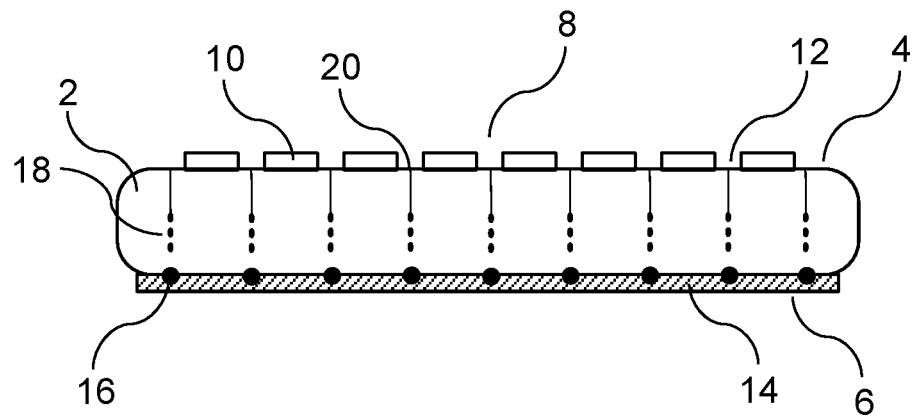
FIG. 3 is a cross-sectional view showing the outcome of the step of applying the laser beam to the substrate illustrated in FIG. 2.
Figure 4:
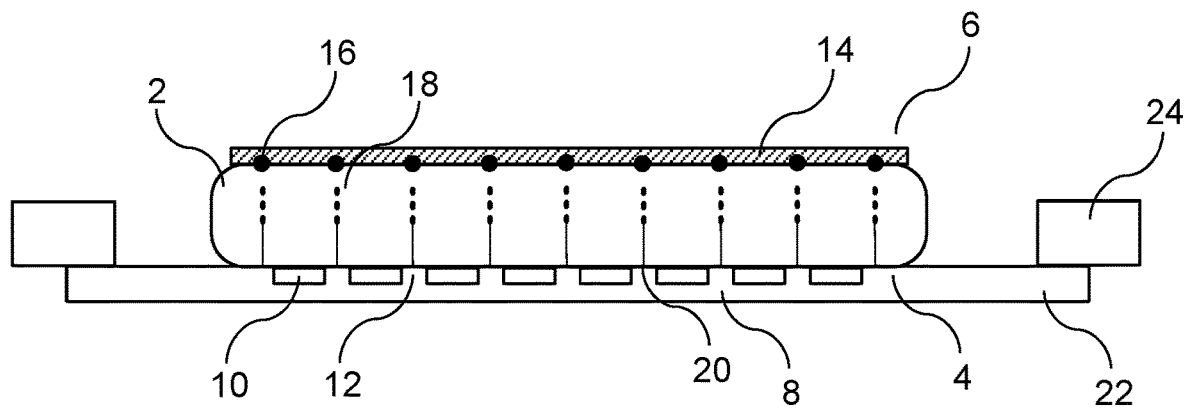
FIG. 4 is a cross-sectional view showing the outcome of a step of attaching the substrate to a sheeting according to the first embodiment of the method of the present invention.

In the first embodiment, the alignment marks 16 are provided so that at least one alignment mark 16 is arranged substantially at the widthwise center of each division line (see FIG. 3). The alignment marks 16 may be, for example, in the form of one or more dots or one or more lines. However, the shapes and the arrangement of the alignment marks 16 are not particularly limited, as has been detailed above.

After forming the alignment marks 16 in the backside layer 14, the pulsed laser beam LB is applied to the substrate 2 from the side of the first surface 4 in a plurality of positions along each division line 12 so as to form a plurality of modified regions 18 in the substrate 2 (see FIGS. 2 and 3). The pulsed laser beam LB applied to the substrate 2 so as to form the plurality of modified regions 18 may be the same as the pulsed laser beam LB applied to the substrate 2 so as to form the plurality of alignment marks 16. Alternatively, two different laser beams may be used for these purposes.

For example, the pulsed laser beam LB applied to the substrate 2 for forming the plurality of modified regions 18 may have the following properties:
Wavelength: 300 to 1100 nm,
Pulse width: 10 to 100 ns,
Pulse energy: 5 to 40 µJ,
Pulse pitch (centre to centre): 6 to 24 µm.

By forming the modified regions 18 after forming the alignment marks 16, it can be ensured that the alignment marks 16 are formed with a particularly high degree of accuracy. In particular, it can be reliably avoided that the modified regions 18 interfere with the process of applying the pulsed laser beam LB for forming the alignment marks 16.

The modified regions 18 are regions of the substrate 2 which have been modified by the application of the pulsed laser beam LB. For example, the modified regions 18 may comprise or be amorphous regions and/or regions in which cracks are formed. The cracks may have dimensions, e.g., lengths and/or widths, in the µm range, as has been detailed above.

In the present embodiment, each modified region 18 is arranged entirely within the bulk of the substrate 2, as is shown in FIGS. 2 and 3. Thus, each modified region 18 extends along only a part of the thickness, in the direction from the first surface 4 towards the second surface 6, of the substrate 2. The amount of extension of the modified regions 18 along the substrate thickness and the position of the modified regions 18 along the substrate thickness can be accurately controlled, for example, by locating the focal point of the pulsed laser beam LB at an appropriate distance from the first surface 4.

As is shown in FIGS. 2 and 3, in each of the plurality of positions along the division lines 12, a plurality of, namely three, modified regions 18 are formed and the modified regions 18 are arranged next to one another along the thickness direction of the substrate 2. In this way, plural layers of modified regions 18 are formed which are stacked along the substrate thickness. However, the number, arrangement, extensions and shapes of the modified regions 18 are not particularly limited.

The formation of the modified regions 18 in the substrate 2 reduces the strength of the substrate 2 in the areas where the modified regions 18 are formed. Hence, the removal of substrate material along the division lines 12, which will be described in detail below, can be considerably facilitated. In particular, the mechanical removal of substrate material, such as the mechanical cutting of the substrate 2, along the division lines 12 can be performed in a more efficient manner, e.g., with an increased processing speed. For the case of a blade or saw dicing process, the blade or saw dicing speed can be significantly increased.

In the present embodiment, while all of the modified regions 18 are arranged entirely inside the substrate 2, cracks 20 are extending from the modified regions 18, in particular, towards the first surface 4. As is shown in FIGS. 2 and 3, optionally, the cracks 20 may extend all the way to the first surface 4. These cracks 20 in the substrate 2 are caused by the modification of the substrate material in the modified regions 18. The presence of the cracks 20 helps to further facilitate the process of dividing the substrate 2 along the division lines 12, as will be detailed below.

After all of the alignment marks 16 and modified regions 18 have been formed (see FIG. 3), the substrate 2 is attached to a sheeting 22. Specifically, the first surface 4 of the substrate 2 is attached to the sheeting 22 so that the sheeting 22 covers the devices 10 formed in the device area 8 (see FIG. 4). The sheeting 22 may be a conventional dicing tape or the protective sheeting described in detail above. For example, the sheeting 22 may comprise or consist of a protective film and/or a cushioning layer and/or a base sheet as detailed above. The sheeting 22 is supported at a peripheral portion thereof by an annular frame 24, so as to close an inner opening of the annular frame 24 by the sheeting 22.

The sheeting 22 may be provided with an adhesive layer (not shown) for attaching the sheeting 22 to the first surface 4 of the substrate 2. The adhesive layer may be arranged only in a peripheral area of the front surface of the sheeting 22.

In this case, in a central area of the front surface of the sheeting 22, the front surface of the sheeting 22 and the first surface 4 are in direct contact with each other. Thus, the risk of a possible contamination of or damage to the first surface 4, in particular, the devices 10, e.g., due to the adhesive force of the adhesive layer or adhesive residues on the substrate 2, can be significantly reduced or even eliminated.

Figure 5:
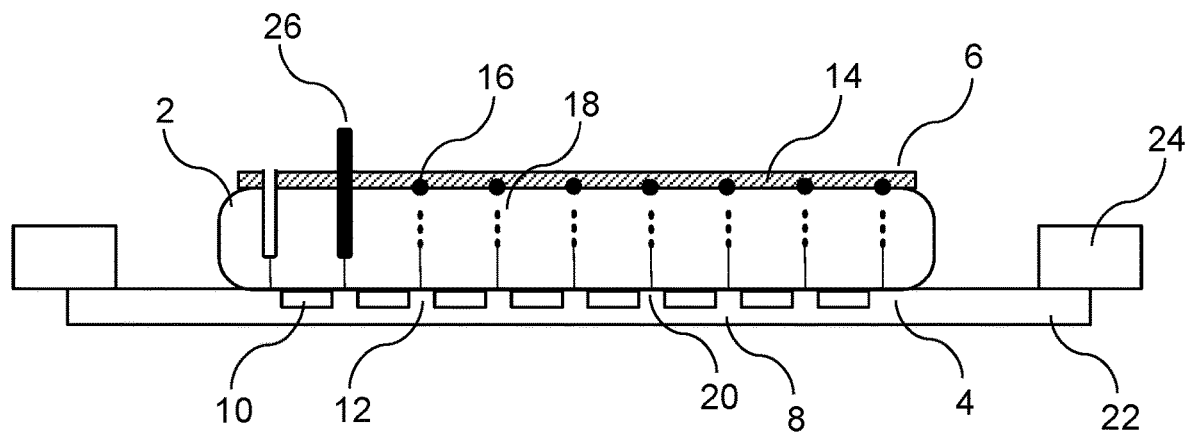
FIG. 5 is a cross-sectional view illustrating a step of cutting the substrate according to the first embodiment of the method of the present invention.

After attaching the substrate 2 to the sheeting 22, substrate material is removed along the division lines 12 from the side of the second surface 6 of the substrate 2, as is illustrated in FIG. 5. The substrate material is removed by mechanically cutting the substrate 2 along the division lines 12, using a dicing blade 26 as a substrate material removing means. Alternatively, for example, the substrate material may be removed by laser cutting, in particular, by laser ablation, using a laser cutting means as the substrate material removing means. The substrate 2 is cut along the division lines 12 through the backside layer 14 (see FIG. 5). Thus, the alignment marks 16 are removed in the cutting process.

The substrate 2 may be cut by a single cut or a step cut, e.g., using a combination of different cutting processes, such as cutting steps employing dicing blades with different cutting widths. The process of cutting the substrate 2 is greatly facilitated by the presence of the modified regions 18, as has been detailed above.

The alignment marks 16 formed in the backside layer 14 are used for aligning the dicing blade 26 relative to the division lines 12 to be cut. Hence, the dicing blade 26 can be aligned relative to the division lines 12 with enhanced alignment accuracy, allowing for the substrate cutting process to be performed with a high degree of precision. Therefore, the width of the division lines 12 can be reduced, enabling the accommodation of an increased number of devices 10 on the first surface 4. In this way, the production efficiency is significantly enhanced and the waste of substrate material is avoided. This is particularly advantageous for the case of expensive substrate materials, such as SiC and GaAs.

As is shown in FIG. 5, the substrate 2 is cut along only a part of the thickness of the substrate 2. In particular, the substrate 2 is cut along the entire extension, in the direction from the second surface 6 towards the first surface 4, of the modified regions 18. In this way, the modified regions 18 are removed in the substrate cutting process. Hence, the die strength of the dies to be obtained from the substrate 2 (see FIG. 7) can be further increased.

A force applied to the substrate 2 by the dicing blade 26 in the substrate cutting process may enhance the propagation of the cracks 20. For example, this force may cause some of the cracks 20 to extend all the way to the first surface 4. In this way, the process of dividing the substrate 2 along the division lines 12 can be further facilitated.

Figure 6:
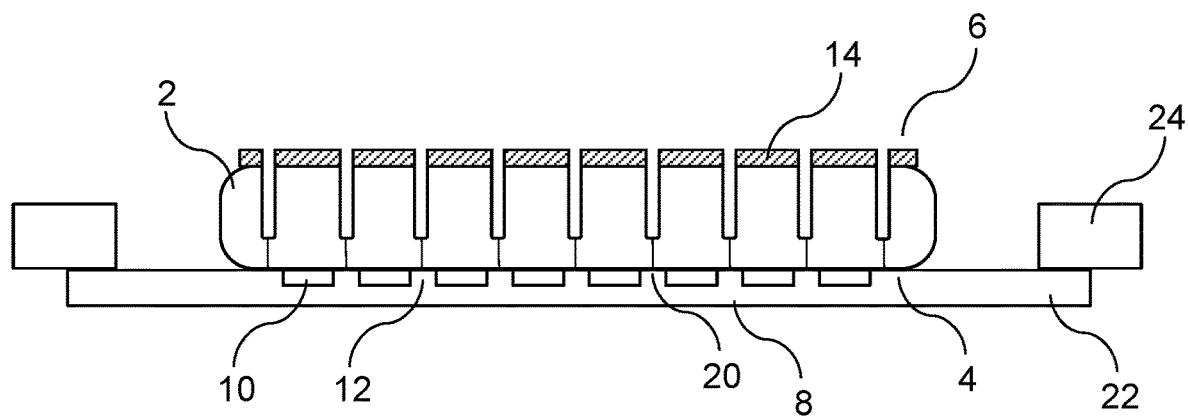
FIG. 6 is a cross-sectional view showing the outcome of the step of cutting the substrate illustrated in FIG. 5.

After the substrate 2 has been cut along all of the division lines 12, as is shown in FIG. 6, the sheeting 22 is radially expanded, e.g., by using an expansion drum or the like. In this way, a radial external force is applied to the substrate 2 so as to divide the substrate 2 along the division lines 12 into individual dies 28 (see FIG. 7). Specifically, the substrate 2 is divided along the division lines 12 where the strength of the substrate 2 is reduced by the presence of the partial cuts formed in the substrate cutting step. The process of dividing the substrate 2 is facilitated even more if the substrate 2 is further weakened along the division lines 12 by cracks 20 extending towards the first surface 4, in particular, all the way to the first surface 4.

After fully dividing the substrate 2 in this manner, the individual dies 28 can be picked up from the sheeting 22, e.g., by using a pick up device (not shown).

Since, in the method of the present embodiment, the substrate 2 is cut along only a part of its thickness and fully divided by applying an external force thereto, the widths of the division lines 12 can be reduced even further. In particular, these widths can be chosen so as to be smaller than the cutting width of the dicing blade 26. For example, the division line widths may be 30 µm or less, preferably 20 µm or less.

In the following, a second embodiment of the method of the present invention will be described with reference to FIGS. 8 and 9.

The method of the second embodiment differs from the method of the first embodiment only in that a protective sheeting 30 (see FIGS. 8 and 9) is attached to the first surface 4 of the substrate 2 before applying the pulsed laser beam LB to the substrate 2.

Figure 8:
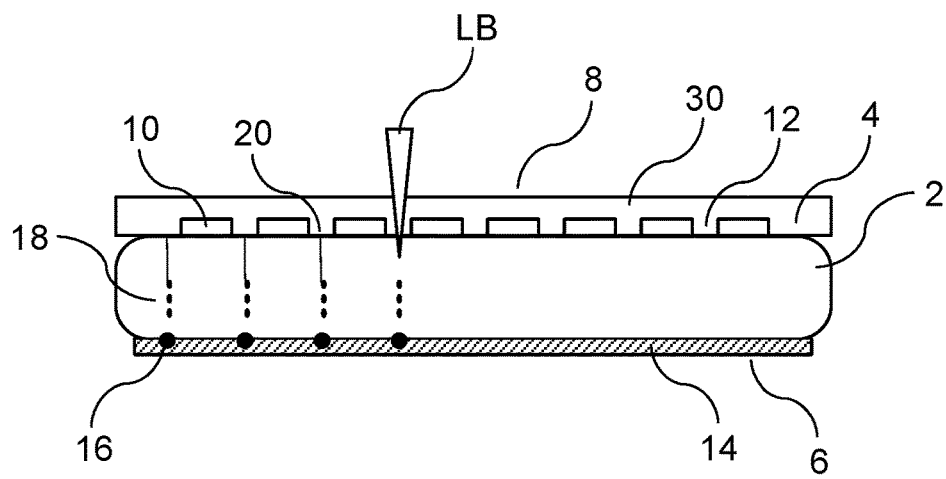
FIG. 8 is a cross-sectional view illustrating a step of applying a laser beam to the substrate according to a second embodiment of the method of the present invention.

The pulsed laser beam LB is applied to the substrate 2, so as to form the alignment marks 16 and the modified regions 18, substantially in the same manner as in the method of the first embodiment (see FIG. 8). However, the pulsed laser beam LB is applied through the protective sheeting 30. The protective sheeting 30 may be made of a material which is transparent to the pulsed laser beam LB so that the pulsed laser beam LB is transmitted through the protective sheeting 30. Alternatively, the pulsed laser beam LB may cut through the protective sheeting 30 so as to reach the first substrate surface 4.

The protective sheeting 30 is attached to the first surface 4 so as to cover the devices 10 formed in the device area 8.

Thus, the devices 10 are reliably protected by the protective sheeting 30 against contamination, e.g., by debris, dust particles or the like, and damage.

The protective sheeting 30 may have the features, properties and characteristics described in detail above. In particular, the protective sheeting 30 may comprise or consist of a protective film and/or a cushioning layer and/or a base sheet as described above.

The protective sheeting 30 may be provided with an adhesive layer (not shown) for attaching the protective sheeting 30 to the first surface 4 of the substrate 2. The adhesive layer may be arranged only in a peripheral area of the front surface of the protective sheeting 30. In this case, in a central area of the front surface of the protective sheeting 30, the front surface of the protective sheeting 30 and the first surface 4 are in direct contact with each other. Thus, the risk of a possible contamination of or damage to the first surface 4, in particular, the devices 10, e.g., due to the adhesive force of the adhesive layer or adhesive residues on the substrate 2, can be significantly reduced or even eliminated.

Alternatively, the protective sheeting 30 may be applied to the first surface 4 so that an entire front surface of the protective sheeting 30 is in direct contact with the first surface 4. In this case, no material, in particular, no adhesive, is present between the front surface of the protective sheeting 30 and the first surface 4. Hence, the risk of a possible contamination of or damage to the first surface 4 can be reliably eliminated.

Figure 9:
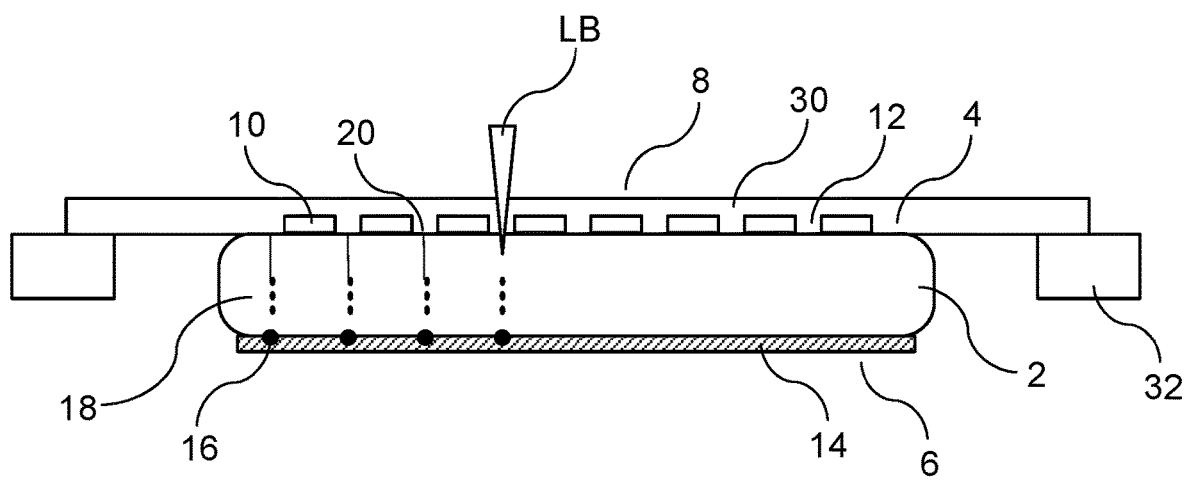
FIG. 9 is a cross-sectional view illustrating a step of applying a laser beam to the substrate according to a modification of the second embodiment of the method of the present invention.

A modification of the second embodiment of the method of the present invention is shown in FIG. 9. In this modification, the second embodiment is modified by supporting a peripheral portion of the protective sheeting 30 by an annular frame 32 (see FIG. 9), so as to close an inner opening of the annular frame 32 by the protective sheeting 30. Also in the modification of the second embodiment, the pulsed laser beam LB is applied to the substrate 2, so as to form the alignment marks 16 and the modified regions 18, substantially in the same manner as in the method of the first embodiment (see FIG. 9).

By providing the annular frame 32, handling of the substrate 2 in the substrate processing steps can be further facilitated and rendered even more efficient. In particular, in this way, the step of attaching the substrate 2 to the sheeting 22 (see FIG. 4) before cutting the substrate 2 can be eliminated.

Figure 7:
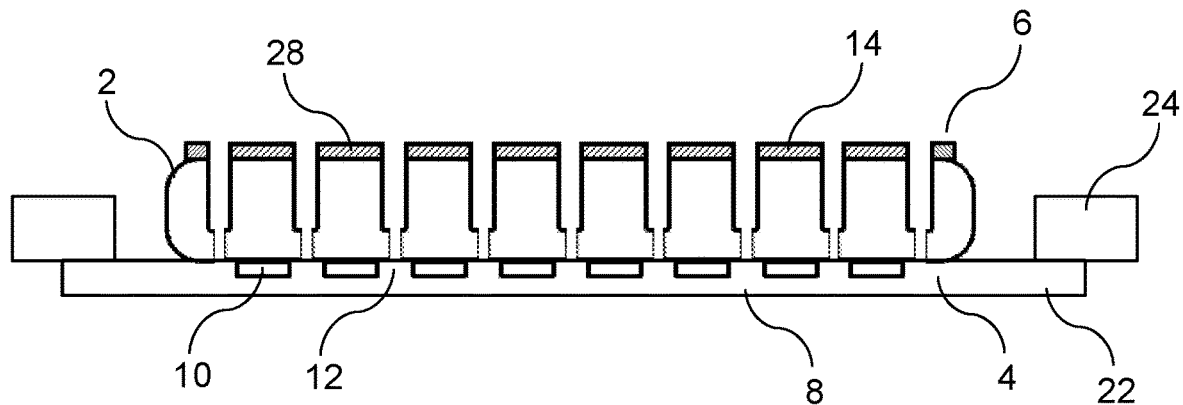
FIG. 7 is a cross-sectional view showing the outcome of a step of applying an external force to the substrate according to the first embodiment of the method of the present invention.

In the second embodiment and the modification thereof, the subsequent steps of cutting and dividing the substrate 2 along the division lines 12 are performed substantially in the same manner as in the first embodiment (see FIGS. 5, 6 and 7). In particular, in the modification of the second embodiment, the protective sheeting 30 is radially expanded, e.g., by using an expansion drum or the like. In this way, a radial external force is applied to the substrate 2 so as to divide the substrate 2 along the division lines 12 into the individual dies 28 (see FIG. 7).

After fully dividing the substrate 2 in this manner, the individual dies 28 can be picked up, e.g., by using a pick up device (not shown).

In the following, a third embodiment of the method of the present invention will be described with reference to FIGS. 10 and 11.

Figure 10:
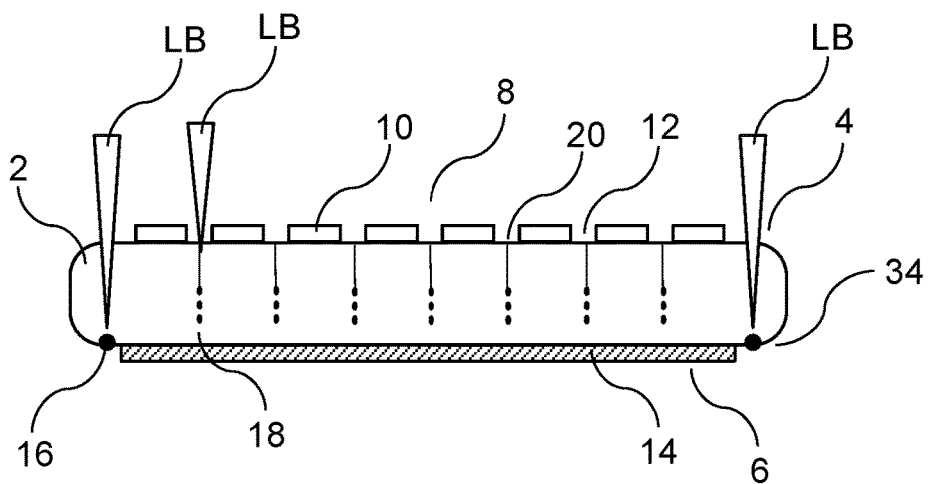
FIG. 10 is a cross-sectional view illustrating a step of applying a laser beam to the substrate according to a third embodiment of the method of the present invention.
Figure 11:
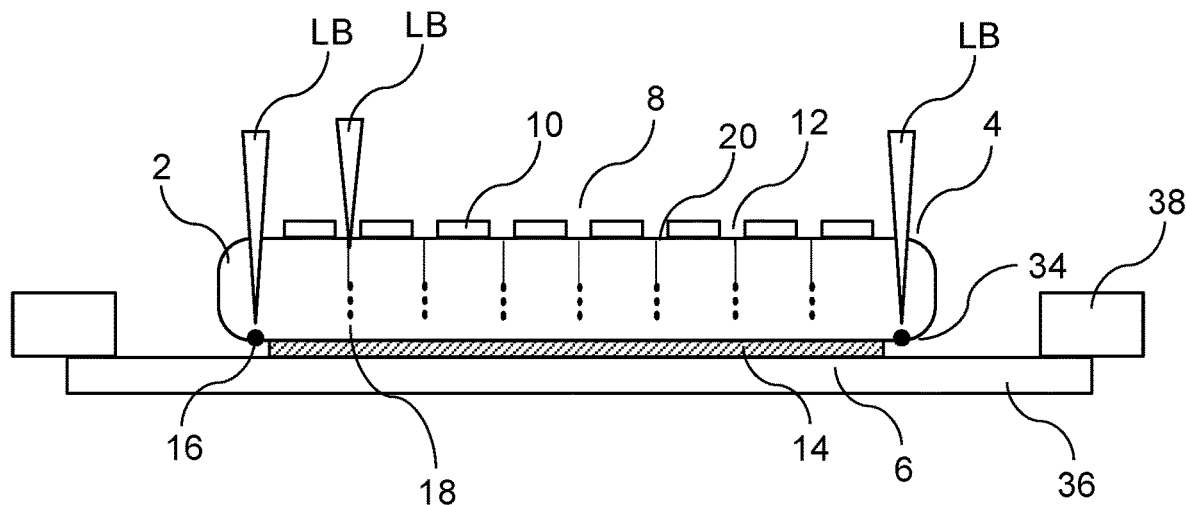
FIG. 11 is a cross-sectional view illustrating a step of applying a laser beam to the substrate according to a modification of the third embodiment of the method of the present invention.

The method of the third embodiment differs from the method of the first embodiment in that the alignment marks 16 are formed in a region of the second surface 6 in which the backside layer 14 is not present (see FIGS. 10 and 11).

As is shown in FIG. 10, the backside layer 14 covers only a part of the second surface 6 of the substrate 2. In particular, the backside layer 14 is only provided in a central portion of the second surface 6. Thus, the backside layer 14 is not present in a peripheral portion 34 of the second surface 6 which surrounds the central portion of the second surface 6.

The peripheral portion 34 may have an at least substantially annular shape. The peripheral portion 34 may have a width, e.g., a ring width, in the range of 0.1 mm to 3 mm. In the present embodiment, the backside layer 14 substantially is present only in an area of the second surface 6 which corresponds to the device area 8 formed on the first surface 4.

In the method of the third embodiment, all of the alignment marks 16 are formed in the peripheral portion 34 of the second surface 6 in which the backside layer 14 is not present (see FIG. 10). In particular, the alignment marks 16 are formed by locating the focal point of the pulsed laser beam LB at a position which is, at least substantially, arranged at the second surface 6 in the peripheral portion 34 thereof (see FIG. 10). By locating the focal point at least substantially at the second surface 6, a considerable portion of the pulsed laser beam LB is absorbed at this surface, thereby forming alignment marks 16 in the peripheral portion 34 which are clearly visible from the side of the second surface 6.

By using these alignment marks 16, the dicing blade 26 can be reliably and accurately aligned relative to the division lines 12 for the subsequent step of cutting the substrate 2 along the division lines 12.

In the method of the third embodiment, the modified regions 18 are formed in the substrate 2 in the same manner as in the method of the first embodiment. The pulsed laser beam LB applied to the substrate 2 so as to form the plurality of modified regions 18 may be the same as the pulsed laser beam LB applied to the substrate 2 so as to form the plurality of alignment marks 16. Alternatively, two different laser beams may be used for these purposes.

A modification of the third embodiment of the method of the present invention is shown in FIG. 11. In this modification, the third embodiment is modified by attaching the second surface 6 of the substrate 2 to a sheeting 36 (see FIG. 11). A peripheral portion of the sheeting 36 is supported by an annular frame 38 (see FIG. 11), so as to close an inner opening of the annular frame 38 by the sheeting 36.

The sheeting 36 may be a conventional dicing tape or a protective sheeting, such as the protective sheeting 30 described above.

By attaching the second surface 6 of the substrate 2 to the sheeting 36 supported by the annular frame 38, handling of the substrate 2 in the substrate processing steps can be further facilitated and rendered even more efficient.

In the third embodiment and the modification thereof, the subsequent steps of cutting and dividing the substrate 2 along the division lines 12 are performed substantially in the same manner as in the first embodiment (see FIGS. 5, 6 and 7).

After fully dividing the substrate 2 in this way, the individual dies 28 can be picked up, e.g., by using a pick up device (not shown).

In the following, a fourth embodiment of the method of the present invention will be described with reference to FIGS. 12 to 17.

The method of the fourth embodiment differs from the method of the first embodiment substantially in that the alignment marks 16 are formed in a protective sheeting.

In the method of the fourth embodiment, before applying the pulsed laser beam LB to the substrate 2, a protective sheeting is attached to the first surface 4 of the substrate 2. In the present embodiment, the protective sheeting is the protective sheeting 30 and may have the features, properties and characteristics described above. In particular, the protective sheeting 30 may be attached to the first surface 4 with or without an adhesive layer (not shown), as has been detailed above.

The protective sheeting 30 is attached to the first surface 4 so as to cover the devices 10 formed in the device area 8. The protective sheeting 30 protects the first surface 4, in particular, the devices 10, against contamination and damage.

Figure 12:
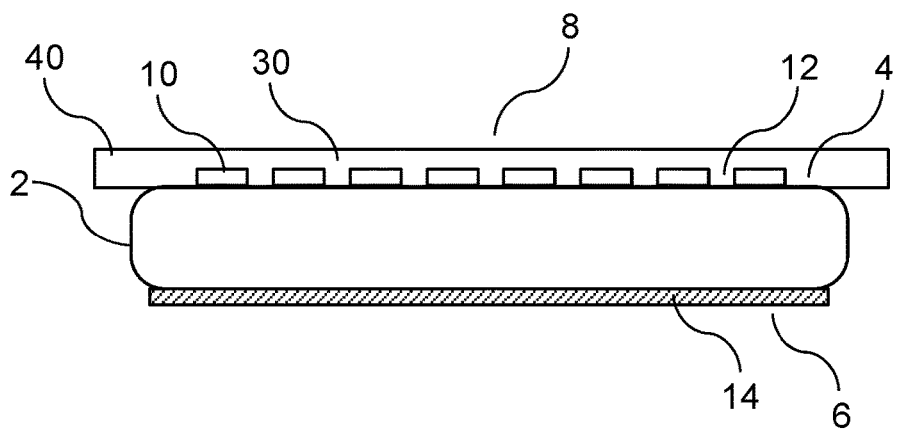
FIG. 12 is a cross-sectional view showing the outcome of a step of attaching a protective sheeting to the substrate according to a fourth embodiment of the method of the present invention.

As is shown in FIG. 12, a portion 40 of the protective sheeting 30 laterally extends beyond the first surface 4. The portion 40 of the protective sheeting 30 surrounds the first surface 4. The portion 40 may have a substantially annular shape. In other embodiments, for example, for the case of a substrate with a rectangular or square shape, the portion 40, at least substantially, may have an open rectangular shape or an open square shape, i.e., a rectangular or square shape, respectively, with an opening in the centre thereof.

Figure 13:
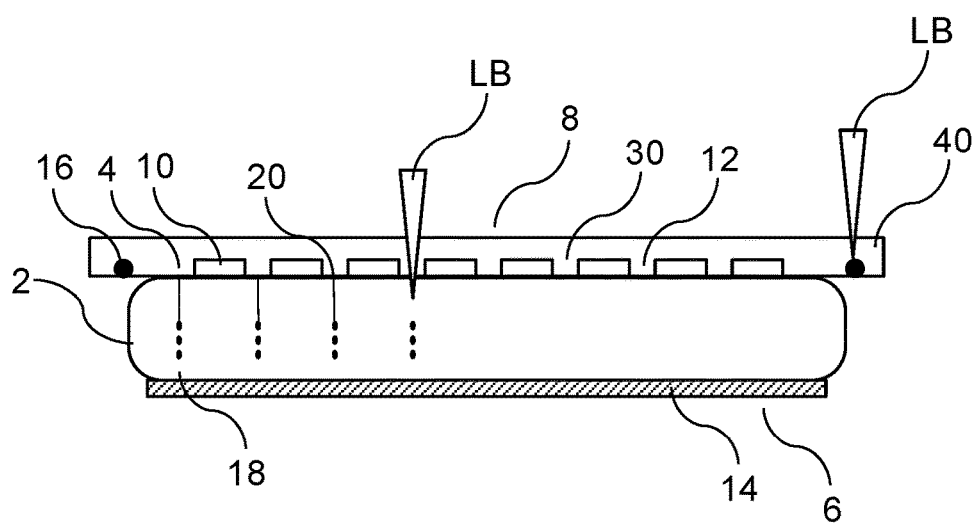
FIG. 13 is a cross-sectional view illustrating a step of applying a laser beam to the substrate according to the fourth embodiment of the method of the present invention.

After attaching the protective sheeting 30 to the first surface 4, modified regions 18 are formed in the substrate 2 and alignment marks 16 are formed in the protective sheeting 30, as is illustrated in FIG. 13. The order of these two steps is not particularly limited. For example, the modified regions 18 may be formed before the alignment marks 16. Alternatively, the alignment marks 16 may be formed before the modified regions 18.

The pulsed laser beam LB is applied to the substrate 2 so as to form the modified regions 18 in the substrate 2 substantially in the same manner as in the method of the second embodiment (see FIGS. 8 and 13). In particular, the pulsed laser beam LB is applied through the protective sheeting 30. The protective sheeting 30 may be made of a material which is transparent to the pulsed laser beam LB so that the pulsed laser beam LB is transmitted through the protective sheeting 30. Alternatively, the pulsed laser beam LB may cut through the protective sheeting 30 so as to reach the first substrate surface 4.

The pulsed laser beam LB is applied to the protective sheeting 30 so as to form the alignment marks 16 in the protective sheeting 30. In particular, the alignment marks 16 are formed in the protective sheeting 30 by locating the focal point of the pulsed laser beam LB at positions in the protective sheeting 30 where the alignment marks 16 are to be formed. All of the alignment marks 16 are formed in the portion 40 of the protective sheeting 30 which laterally extends beyond the first surface 4 (see FIG. 13). In this way, the dicing blade 26 can be aligned relative to the division lines 12 with particularly high alignment accuracy, allowing for the substrate cutting process (see FIG. 14) to be performed with an especially high degree of precision.

In the present embodiment, the pulsed laser beam LB applied to the substrate 2 for forming the modified regions 18 may be the same as the pulsed laser beam LB applied to the protective sheeting 30 for forming the alignment marks 16. Alternatively, two different laser beams may be used for these purposes.

Figure 14:
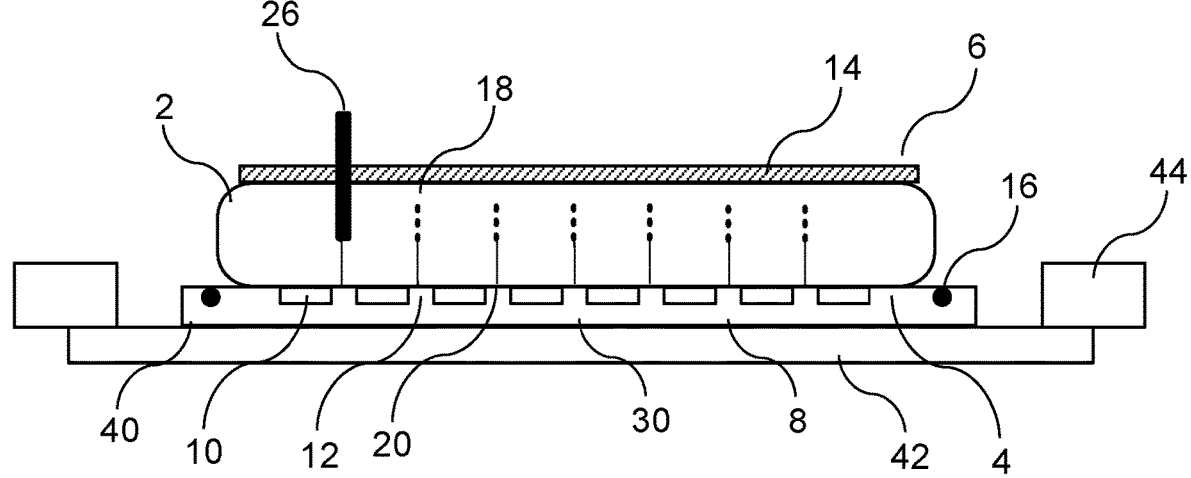
FIG. 14 is a cross-sectional view showing the outcome of a step of attaching the substrate to a sheeting and illustrating a step of cutting the substrate according to the fourth embodiment of the method of the present invention.

After all of the alignment marks 16 and modified regions 18 have been formed, the substrate 2 is attached to a further sheeting 42 (see FIG. 14). Specifically, the first surface 4 of the substrate 2, having the protective sheeting 30 provided thereon, is attached to the sheeting 42. The sheeting 42 may be a conventional dicing tape. The sheeting 42 is supported at a peripheral portion thereof by an annular frame 44, so as to close an inner opening of the annular frame 44 by the sheeting 42, as is shown in FIG. 14. In this way, handling of the substrate 2 in the substrate processing steps can be further facilitated.

After attaching the substrate 2 to the sheeting 42, the substrate 2 is cut along the division lines 12 from the side of the second surface 6 by using the dicing blade 26 (see FIG. 14) substantially in the same manner as in the method of the first embodiment. In particular, the substrate 2 is cut along the division lines 12 through the backside layer 14.

The alignment marks 16 formed in the portion 40 of the protective sheeting 30, which are clearly visible from the side of the second surface 6 (see FIG. 14), are used for aligning the dicing blade 26 relative to the division lines 12 to be cut. Hence, the dicing blade 26 can be aligned relative to the division lines 12 with enhanced alignment accuracy, allowing for the substrate cutting process to be performed with a high degree of precision. Therefore, the width of the division lines 12 can be reduced, enabling the accommodation of an increased number of devices 10 on the first surface 4. In this way, the production efficiency is significantly enhanced and the waste of substrate material is avoided.

After the substrate 2 has been cut along all of the division lines 12, the sheeting 42 is radially expanded, e.g., by using an expansion drum or the like. In this way, a radial external force is applied to the substrate 2 so as to divide the substrate 2 along the division lines 12 into the individual dies 28, substantially in the same manner as in the method of the first embodiment (see FIG. 7).

After fully dividing the substrate 2 in this manner, the individual dies 28 can be picked up, e.g., by using a pick up device (not shown).

Figure 15:
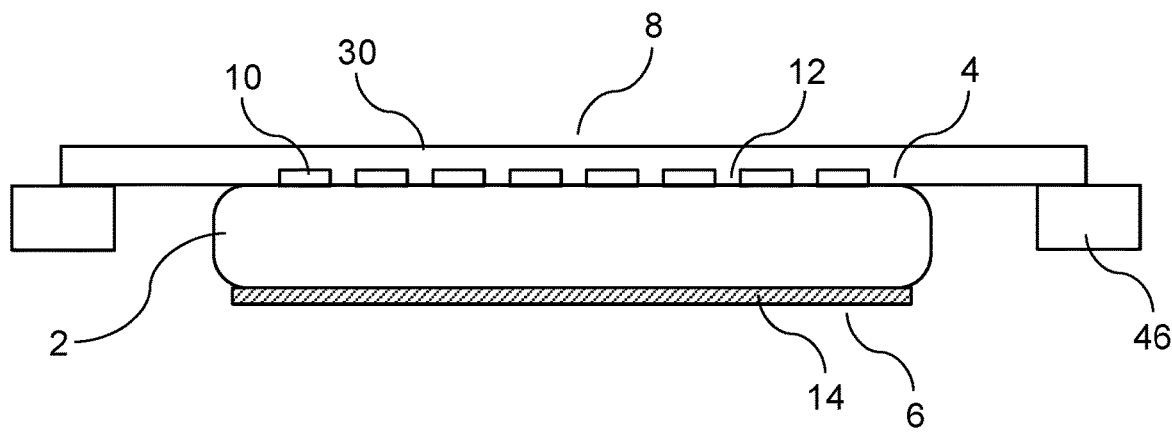
FIG. 15 is a cross-sectional view showing the outcome of a step of attaching a protective sheeting to the substrate according to a modification of the fourth embodiment of the method of the present invention.
Figure 16:
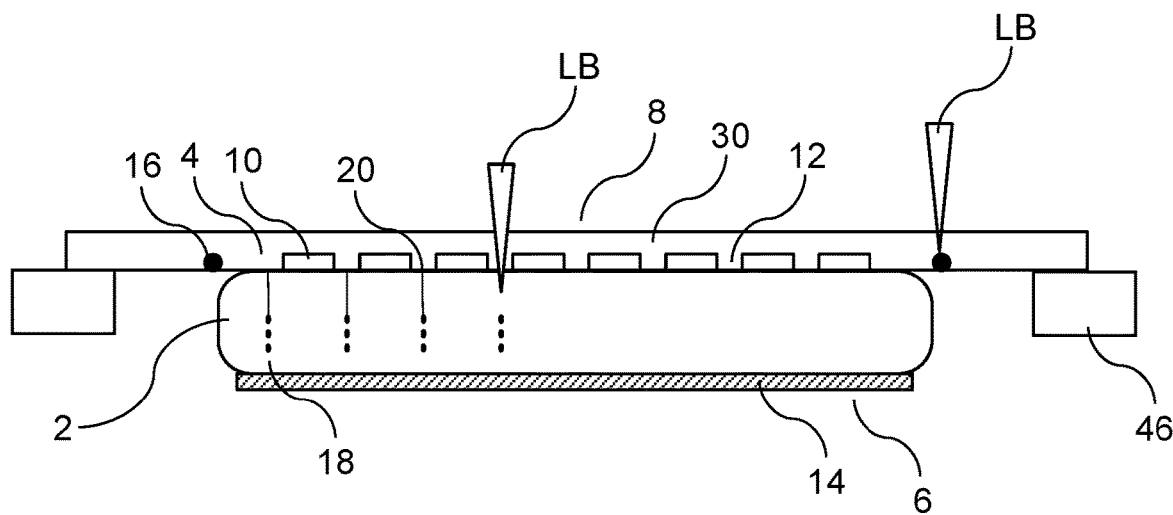
FIG. 16 is a cross-sectional view illustrating a step of applying a laser beam to the substrate according to the modification of the fourth embodiment of the method of the present invention.
Figure 17:
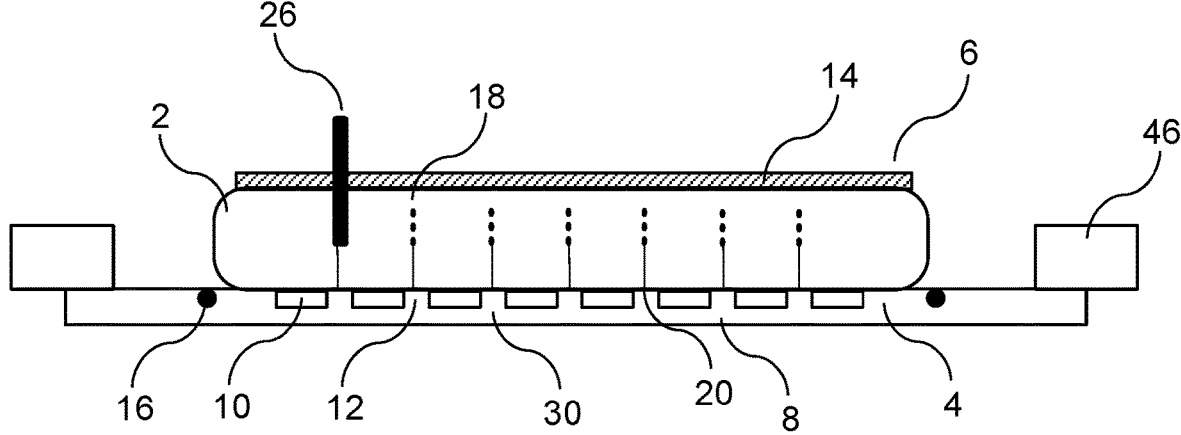
FIG. 17 is a cross-sectional view illustrating a step of cutting the substrate according to the modification of the fourth embodiment of the method of the present invention.

A modification of the fourth embodiment of the method of the present invention is shown in FIGS. 15 to 17. In this modification, the fourth embodiment is modified by using a protective sheeting 30 which laterally extends further beyond the first surface 4 than the protective sheeting 30 of the fourth embodiment and by attaching a laterally outermost portion of the protective sheeting 30 to an annular frame 46 (see FIG. 15). The protective sheeting 30 is attached to the annular frame 46 so as to close an inner opening of the annular frame 46 by the protective sheeting 30.

By providing the annular frame 46 in this manner, handling of the substrate 2 in the substrate processing steps can be further facilitated and rendered even more efficient. In particular, in this way, the step of attaching the substrate 2 to the sheeting 42 (see FIG. 14) before cutting the substrate 2 can be eliminated.

After attaching the protective sheeting 30 to the first surface 4, modified regions 18 are formed in the substrate 2 and alignment marks 16 are formed in the protective sheeting 30, in substantially the same manner as in the method of the fourth embodiment (see FIGS. 13 and 16).

After all of the alignment marks 16 and modified regions 18 have been formed, the substrate 2 is cut along the division lines 12 from the side of the second surface 6 by using the dicing blade 26, substantially in the same manner as in the method of the fourth embodiment (see FIGS. 14 and 17).

Subsequently, after the substrate 2 has been cut along all of the division lines 12, the protective sheeting 30 is radially expanded, e.g., by using an expansion drum or the like. In this way, a radial external force is applied to the substrate 2 so as to divide the substrate 2 along the division lines 12 into the individual dies 28 (see FIG. 7). In the method of the modification of the fourth embodiment, only a single sheeting, namely the protective sheeting 30, is attached to the first surface 4 of the substrate 2. Hence, the process of dividing the substrate 2 can be performed in a particularly efficient and reliable manner, by radially expanding the protective sheeting 30.

After fully dividing the substrate 2 in this manner, the individual dies 28 can be picked up, e.g., by using a pick up device (not shown).

In the following, a fifth embodiment of the method of the present invention will be described with reference to FIGS. 18 to 20.

The method of the fifth embodiment differs from the method of the modification of the fourth embodiment in the configuration of the protective sheeting 30.

Figure 18:
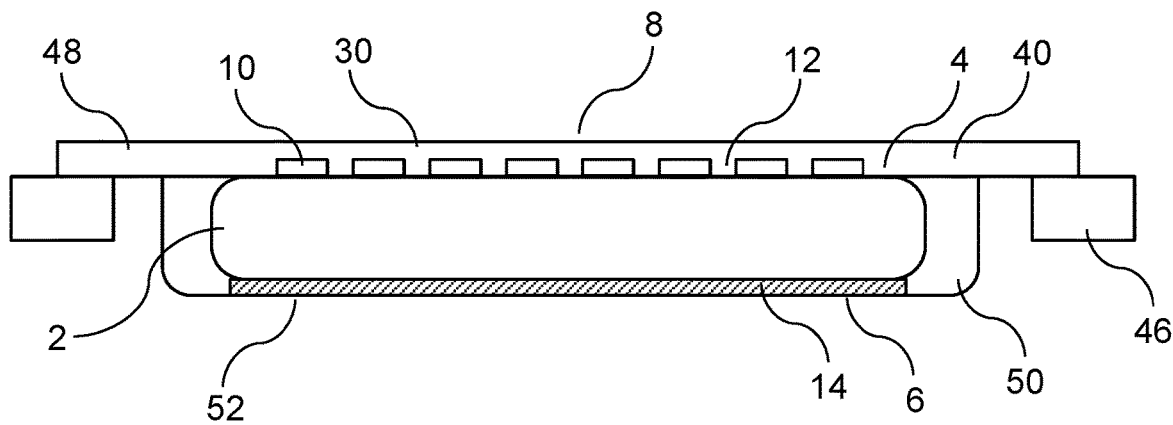
FIG. 18 is a cross-sectional view showing the outcome of a step of attaching a protective sheeting to the substrate according to a fifth embodiment of the method of the present invention.

In particular, in the method of the fifth embodiment, the protective sheeting 30 comprises a base sheet 48 and a cushioning layer 50 (see FIG. 18). The cushioning layer 50 is attached to the first surface 4. Further, a protective film (not shown) is provided so as to be arranged between the first surface 4 and the cushioning layer 50, as has been detailed above. Moreover, the protective film is arranged between side walls of the substrate 2 and the cushioning layer 50. By providing the protective film, the possibility of a contamination of the substrate 2 by the material of the cushioning layer 50 is reliably prevented. The protective film may be attached to the first surface 4 with or without an adhesive layer, as has been described in detail above.

Substantially the entire substrate 2 is embedded in the cushioning layer 50. However, a back surface 52 of the backside layer 14 is exposed, i.e., not covered by the cushioning layer 50 (see FIG. 18). The cushioning layer 50 may have a thickness which is substantially the same as the thickness of the substrate 2, e.g., 100 to 150 µm.

The portion 40 of the protective sheeting 30 laterally extending beyond the first surface 4, which is to a substantive extent formed by the cushioning layer 50, extends from the first surface 4 towards the second surface 6 along substantially the entire thickness of the substrate 2 (see FIG. 18).

The protective sheeting 30, comprising the base sheet 48, the cushioning layer 50 and the protective film, serves as a particularly reliable carrier for supporting the substrate 2 during the substrate cutting and dividing processes. Any undesired shift of the substrate 2 or the resulting dies 28 (see FIG. 7) can be reliably avoided.

A front surface of the base sheet 48 is in contact with a back surface of the cushioning layer 50. A back surface of the base sheet 48 opposite the front surface thereof may be substantially parallel to the second surface 6 of the substrate. Thus, when cutting the substrate 2 along the division lines 12 from the side of the second surface 6 by using the dicing blade 26, a suitable counter pressure can be applied to the back surface of the base sheet 48, e.g., by placing this back surface on a chuck table (not shown).

The material of the base sheet is not particularly limited. For example, the base sheet may be made of a polymer material, e.g., polyvinyl chloride (PVC), ethylene vinyl acetate (EVA) or a polyolefin.

The material of the cushioning layer is not particularly limited. For example, the cushioning layer may be formed of a resin, an adhesive, a gel or the like.

The material of the protective film is not particularly limited. For example, the protective film may be made of a plastic material, such as a polymer, e.g., a polyolefin. In particular, the protective film may be made of polyethylene (PE), polypropylene (PP) or polybutylene (PB).

The base sheet 48, the cushioning layer 50 and the protective film are made of materials which are transparent to the pulsed laser beam LB so that the pulsed laser beam LB is transmitted through the base sheet 48, the cushioning layer 50 and the protective film.

Figure 19:
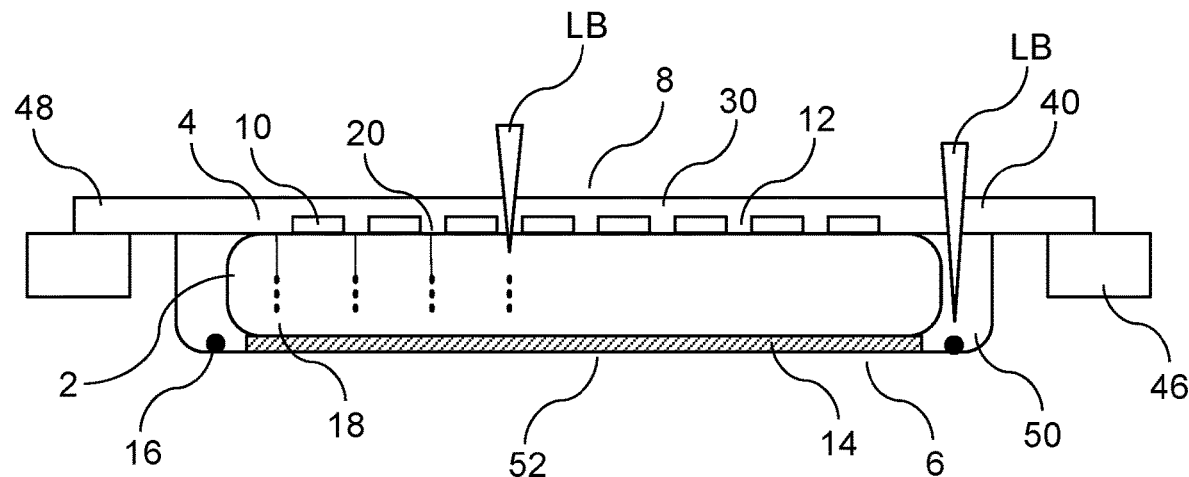
FIG. 19 is a cross-sectional view illustrating a step of applying a laser beam to the substrate according to the fifth embodiment of the method of the present invention.
Figure 20:
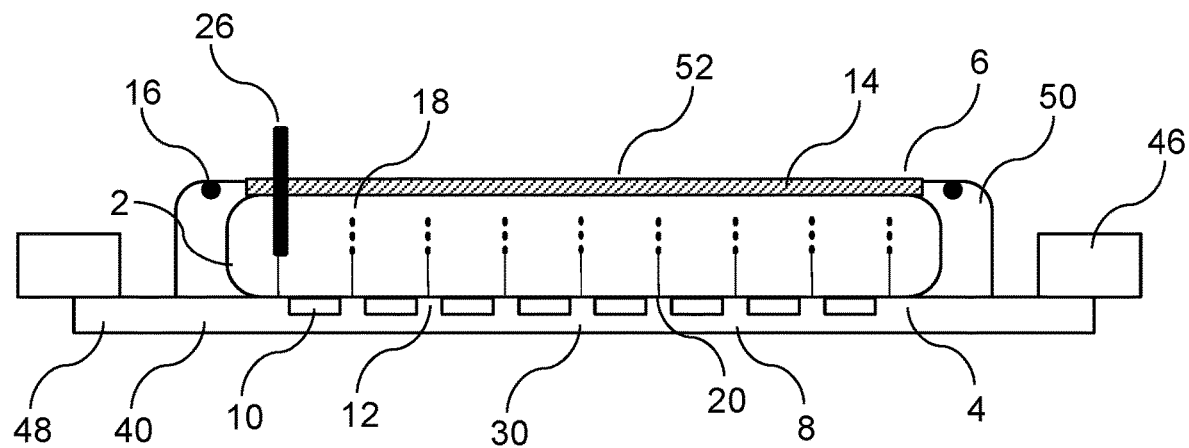
FIG. 20 is a cross-sectional view illustrating a step of cutting the substrate according to the fifth embodiment of the method of the present invention.

After attaching the protective sheeting 30 to the first surface 4, modified regions 18 are formed in the substrate 2 and alignment marks 16 are formed in the protective sheeting 30, as is illustrated in FIG. 19. The order of these two steps is not particularly limited. For example, the modified regions 18 may be formed before the alignment marks 16. Alternatively, the alignment marks 16 may be formed before the modified regions 18.

The pulsed laser beam LB is applied to the substrate 2 so as to form the modified regions 18 in the substrate 2 substantially in the same manner as in the method of the second embodiment (see FIGS. 8 and 19). In particular, the pulsed laser beam LB is applied through the protective sheeting 30 which is transparent to the pulsed laser beam LB.

The pulsed laser beam LB is applied to the protective sheeting 30 so as to form the alignment marks 16 in the protective sheeting 30. All of the alignment marks 16 are formed in the portion 40 of the protective sheeting 30 which laterally extends beyond the first surface 4. Specifically, all of the alignment marks 16 are formed in the cushioning layer 50 in a position which is, at least substantially, arranged at the second surface 6 of the substrate 2 (see FIG. 19). In this way, the alignment accuracy with which the dicing blade 26 can be aligned relative to the division lines 12 (see FIG. 20) can be enhanced even further.

In the present embodiment, the pulsed laser beam LB applied to the substrate 2 for forming the modified regions 18 may be the same as the pulsed laser beam LB applied to the protective sheeting 30 for forming the alignment marks 16. Alternatively, two different laser beams may be used for these purposes.

After all of the alignment marks 16 and modified regions 18 have been formed, the substrate 2 is cut along the division lines 12 from the side of the second surface 6 by using the dicing blade 26 (see FIG. 20) substantially in the same manner as in the method of the first embodiment. In particular, the substrate 2 is cut along the division lines 12 through the backside layer 14.

The alignment marks 16 formed in the cushioning layer 50 of the protective sheeting 30, which are particularly clearly visible from the side of the second surface 6 (see FIG. 20), are used for aligning the dicing blade 26 relative to the division lines 12 to be cut. Hence, the dicing blade 26 can be aligned relative to the division lines 12 with yet further enhanced alignment accuracy, allowing for the substrate cutting process to be performed with an especially high degree of precision.

After the substrate 2 has been cut along all of the division lines 12, the protective sheeting 30 is radially expanded, e.g., by using an expansion drum or the like. In this way, a radial external force is applied to the substrate 2 so as to divide the substrate 2 along the division lines 12 into the individual dies 28, substantially in the same manner as in the method of the first embodiment (see FIG. 7).

After fully dividing the substrate 2 in this manner, the individual dies 28 can be picked up, e.g., by using a pick up device (not shown).

The invention claimed is:

1. A method of processing a substrate having a first surface with at least one division line formed thereon and a second surface opposite the first surface, the method comprising:
   attaching a protective sheeting to the first surface,
   applying a laser beam to the protective sheeting so as to form a plurality of alignment marks in the protective sheeting, and removing substrate material along the at least one division line from the side of the second surface by using a substrate material removing means, wherein the alignment marks are used for aligning the substrate material removing means relative to the at least one division line.

2. The method according to claim 1, wherein
a portion of the protective sheeting laterally extends beyond the first surface, and
at least one of the alignment marks is formed in the portion of the protective sheeting laterally extending beyond the first surface.

3. The method according to claim 2, wherein
the portion of the protective sheeting laterally extending beyond the first surface extends along a thickness direction of the substrate from the first surface towards the second surface, and
at least one of the alignment marks is formed in the portion of the protective sheeting laterally extending beyond the first surface in a position which is closer to the second surface than to the first surface.

4. The method according to claim 1, wherein a backside layer, in particular, a metal layer, is formed on the second surface.

5. The method according to claim 1, wherein the protective sheeting is made of a material which is transparent to the laser beam.

6. A method of processing a substrate, having a first surface with at least one division line formed thereon and a second surface opposite the first surface, wherein a backside layer is formed on the second surface and the method comprises:

applying a laser beam to the substrate from the side of the first surface, wherein the substrate is made of a material which is transparent to the laser beam and the laser beam is applied to the substrate in a condition where a focal point of the laser beam is located at a position inside the substrate which is closer to the second surface than to the first surface, so as to form a plurality of alignment marks in the backside layer and/or in a region of the second surface in which the backside layer is not present, and removing substrate material along the at least one division line from the side of the second surface by using a substrate material removing means, wherein the alignment marks are used for aligning the substrate material removing means relative to the at least one division line.

7. The method according to claim 6, wherein the backside layer is a metal layer.

8. The method according to claim 7, further comprising attaching a protective sheeting to the first surface, wherein
the protective sheeting is made of a material which is transparent to the laser beam, and
the laser beam is applied to the substrate through the protective sheeting.

9. The method according to claim 1, further comprising applying a laser beam to the substrate from the side of the first surface, wherein the substrate is made of a material which is transparent to the laser beam and the laser beam is applied to the substrate at least in a plurality of positions along the at least one division line so as to form a plurality of modified regions in the substrate.

10. The method according to claim 1, wherein the substrate material is mechanically removed along the at least one division line, in particular, by mechanically cutting the substrate along the at least one division line.

11. The method according to claim 1, wherein the substrate material is removed along the at least one division line by laser cutting, in particular, by laser ablation.

12. The method according to claim 1, wherein the substrate material is removed along only a part of the thickness, in the direction from the second surface towards the first surface, of the substrate.

13. The method according to claim 1, further comprising applying an external force to the substrate after removing substrate material along the at least one division line so as to divide the substrate along the at least one division line.

* * * * *

UNITED STATES PATENT AND TRADEMARK OFFICE
CERTIFICATE OF CORRECTION

| | |
|---|---|
| PATENT NO. | : 11,424,161 B2 |
| APPLICATION NO. | : 16/823983 |
| DATED | : August 23, 2022 |
| INVENTOR(S) | : Karl Heinz Priewasser et al. |

It is certified that error appears in the above-identified patent and that said Letters Patent is hereby corrected as shown below:

On the Title Page

Item (30) Insert the following information:
-- (30) Foreign Application Priority Data
March 29, 2019 (DE)............10 2019 204 457.3 --

Signed and Sealed this
Eighteenth Day of October, 2022

Katherine Kelly Vidal
*Director of the United States Patent and Trademark Office*